US005791042A

United States Patent [19]
Baum et al.

[11] Patent Number: 5,791,042
[45] Date of Patent: Aug. 11, 1998

[54] METHOD FOR SUPPORT AND ALIGNMENT OF ELECTRONIC MODULES

[75] Inventors: Henry Baum, Livermore; Don DelFava, San Carlos; Gregory P. Hayward, Sunnyvale, all of Calif.

[73] Assignee: Ericsson Inc., Menlo Park, Calif.

[21] Appl. No.: 688,540

[22] Filed: Jul. 30, 1996

[51] Int. Cl.$^6$ ....................................................... H05K 3/36
[52] U.S. Cl. ................................................ 29/830; 29/760
[58] Field of Search ............................. 29/760, 759, 832, 29/833, 827, 830

[56] References Cited

U.S. PATENT DOCUMENTS

| | | | |
|---|---|---|---|
| 4,479,298 | 10/1984 | Hug | 29/827 X |
| 4,580,858 | 4/1986 | Daberkoe | 29/760 X |
| 4,719,695 | 1/1988 | Sturner | 29/760 |
| 5,311,408 | 5/1994 | Ferchau et al. | |
| 5,395,249 | 3/1995 | Reynolds et al. | |

Primary Examiner—Carl J. Arbes
Attorney, Agent, or Firm—Lyon & Lyon LLP

[57] ABSTRACT

An apparatus and method for support and alignment of electronic modules. Electronic modules have V-shaped grooves in their top and bottom surfaces. A rack assembly includes an upper frame and a lower frame, each having a plurality of parallel guide members attached to a support member. The upper and lower frames are advantageously constructed as mirror images of each other. The guide members are adapted to be received in the grooves in the electronic modules, the guide members of the upper frame receiving the grooves in the top surfaces of the modules and the guide members of the lower frame receiving the grooves in the bottom surfaces of the modules. A module is installed in the assembly by aligning the grooves in the module with the corresponding guide members of the frames and pushing the module into the rack assembly. As the module moves into the assembly, the guide members are received in the grooves of the module thereby supporting the module and aligning electrical connectors on the module with electrical connectors on a backplane or other unit.

4 Claims, 5 Drawing Sheets

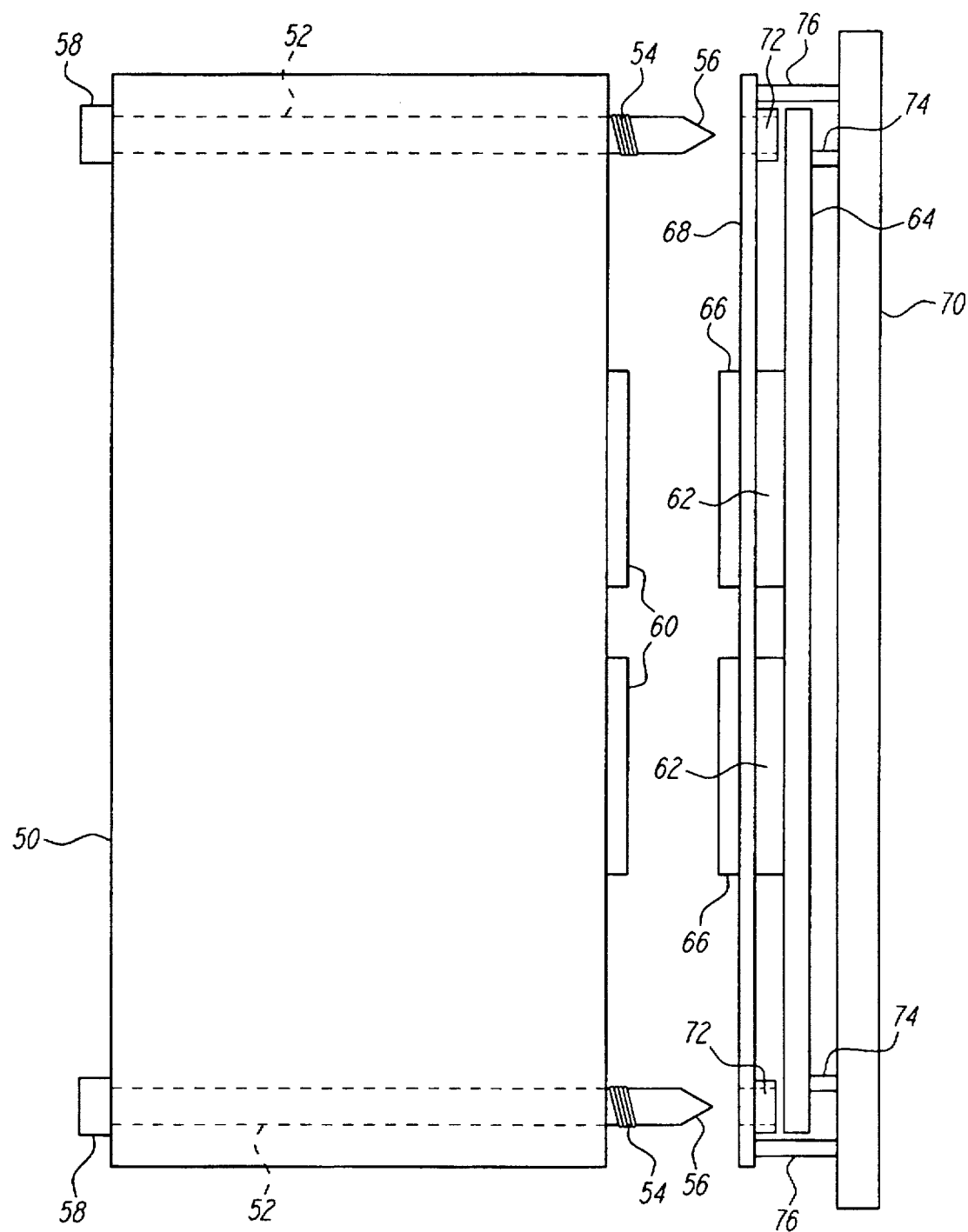
*FIG. A*
*(PRIOR ART)*

METHOD FOR SUPPORT AND ALIGNMENT OF ELECTRONIC MODULES

FIELD OF THE INVENTION

This invention pertains to the field of electronic module supports and, more specifically, to an apparatus and method for support and alignment of electronic modules within an enclosure.

BACKGROUND OF THE INVENTION

Electronic equipment is often composed of a plurality of electronic assemblies such as printed circuit boards and/or electronic modules. The printed circuit boards and electronic modules typically consist of numerous electronic components electrically connected into an individual assembly. To house a number of these electronic assemblies in a single location, electronic enclosures are generally used in which a plurality of electronic assemblies are installed. Each electronic assembly has electrical connectors, usually located at one end, which mate with electrical connectors disposed on a backplane within the enclosure. When the electronic assembly is inserted into the enclosure, the connectors on the assembly couple with the connectors on the backplane. Therefore, when installing electronic modules into an enclosure, it is necessary to align the connectors on the modules with the connectors on the backplane of the enclosure prior to insertion.

Known conventional electronic enclosures comprise a plurality of supports, such as guides or brackets, into which the electronic assemblies are mounted. The supports are aligned in parallel so that the electronic assemblies are parallel to each other when installed in the enclosure. The electronic assemblies are usually installed in the enclosure by sliding them inward in a direction parallel to the adjacent electronic assemblies.

For example, presently available enclosures designed for open printed circuit board assemblies, commonly referred to as "card cages," generally comprise card guides mounted at opposite ends of the mounting area of the printed circuit board assembly. Hence, if the printed circuit boards are installed in a vertical position, i.e. the flat mounting board of the printed circuit board is oriented vertically, then the card guides are mounted on horizontal members of the enclosure located above and below the mounting area of the printed circuit board. Known card guides are rectangular shaped channels which slidably receive the opposite edges of a printed circuit board. While this design is suitable for open printed circuit boards, it is not well suited to accommodating closed, electronic modules because the card guides would have to be very large to accommodate the width of the electronic assemblies.

Conventional enclosures designed to accommodate electronic modules typically utilize a cantilever support scheme. Referring to the drawings, FIG. A illustrates a side view of an exemplary design. An electronic module 50, usually a sealed box, is often used in radio frequency and high frequency applications to shield the electronics for electromagnetic interference (EMI). The electronic module 50 is usually provided with alignment rods consisting of cylindrical rods having a screw thread portion 54 and a conical guide 56 at one end. The conical guides 56 and thread portions 54 extend from the back end of the module 50. The conical guides 56 act as lead-in guides. A second end of the alignment rods 52 consists of a head part 58 which can be engaged by a tool (not shown), such as a wrench or screw driver, to tighten the alignment rods 54.

Module electrical connectors 60 are provided at the back end of the module 50. Backplane electrical connectors 62 which mate with the module electrical connectors 60 are disposed on a backplane 64. The backplane electrical connectors 62 protrude through slots 66 in a heat plate 68. The backplane 64 and heat plate 68 are attached to a rear wall 70 of the enclosure using standoffs 74 and 76, respectively, and fasteners (not shown). The heat plate 68 has threaded alignment bushings 72 which couple with the alignment rods 52.

As the module 50 is installed in the enclosure, the conical guides 56 must be aligned with the alignment bushings 72 in the heat plate 68. The alignment rods 52 are threaded into the alignment bushings 72 and tightened to secure the module 50 and couple the module 50 to the heat plate 68.

A major disadvantage associated with these enclosures is that they do not support the module 50 until shortly before the module 50 is completely inserted into the enclosure. Moreover, the alignment of the conical guides 56 and the alignment bushings 72 is extremely difficult because it is generally a blind process, alignment occurring deep within the enclosure and behind the module 50. The installation is even more cumbersome for heavy modules because the installer must support the weight of the module 50 until the alignment rods enter the alignment bushings which does not occur until the module 50 is inserted most of the way into the enclosure.

Therefore, there is a need for an improved apparatus and method for supporting and aligning electronic modules within an enclosure which is directed to overcoming the disadvantages associated with the aforementioned designs.

SUMMARY OF THE INVENTION

The present invention comprises an apparatus and method for supporting and aligning electronic modules in an enclosure which easily aligns and supports the module during installation and removal from the enclosure.

A rack assembly is provided for accommodating electronic modules having an alignment groove formed in the top and bottom surfaces of the electronic module. One end of the module may have electrical connectors which mate with electrical connectors on a backplane of an electronics enclosure. The rack assembly preferably attaches to a panel, such as a heat plate or backplane, which may be installed in an electronics enclosure.

The rack assembly preferably comprises a first frame and a second frame which comprise a plurality of parallel guide members. The guide members are adapted to be received in a groove formed in the top and bottom surfaces of an electronic module designed to be installed in the enclosure. The guide members on one frame are preferably a mirror image of the guide members on the opposing frame.

The two frames with guide members are preferably attached to a panel. The panel may be a heat plate, backplane or rear wall of the enclosure depending on the requirements of the application. The frames are preferably oriented such that the insertion/removal direction of the guide members is substantially perpendicular to the panel, and they are preferably positioned parallel to one another.

An electronic module designed to be installed in the rack advantageously has grooves formed on opposite ends of the module. The grooves are adapted to receive the guide members. The electronic module is preferably installed in the rack assembly by aligning the leading edge of the grooves in the electronic module with the guide members of the rack assembly at the entrance of the rack assembly. The electronic module is then pushed into the rack assembly toward the panel. As the electronic module is moved into the rack assembly, the guide members are received in the grooves of the electronic module which aligns the connectors of the electronic module with the mating connectors on a backplane of the enclosure.

Accordingly, it is an object of the present invention to provide an apparatus and method for supporting and aligning electronic modules.

It is another object of the present invention to provide an apparatus and method for supporting and aligning electronic modules which supports the module largely throughout the installation and removal process.

It is still another object of the present invention to provide an apparatus and method for supporting and aligning electronic modules which facilitates installation by aligning the module at or near the entrance of the apparatus.

BRIEF DESCRIPTION OF THE DRAWINGS

FIG. A is side view of an exemplary design of a conventional electronic module support scheme.

DETAILED DESCRIPTION OF THE PREFERRED EMBODIMENT

Figure 1:
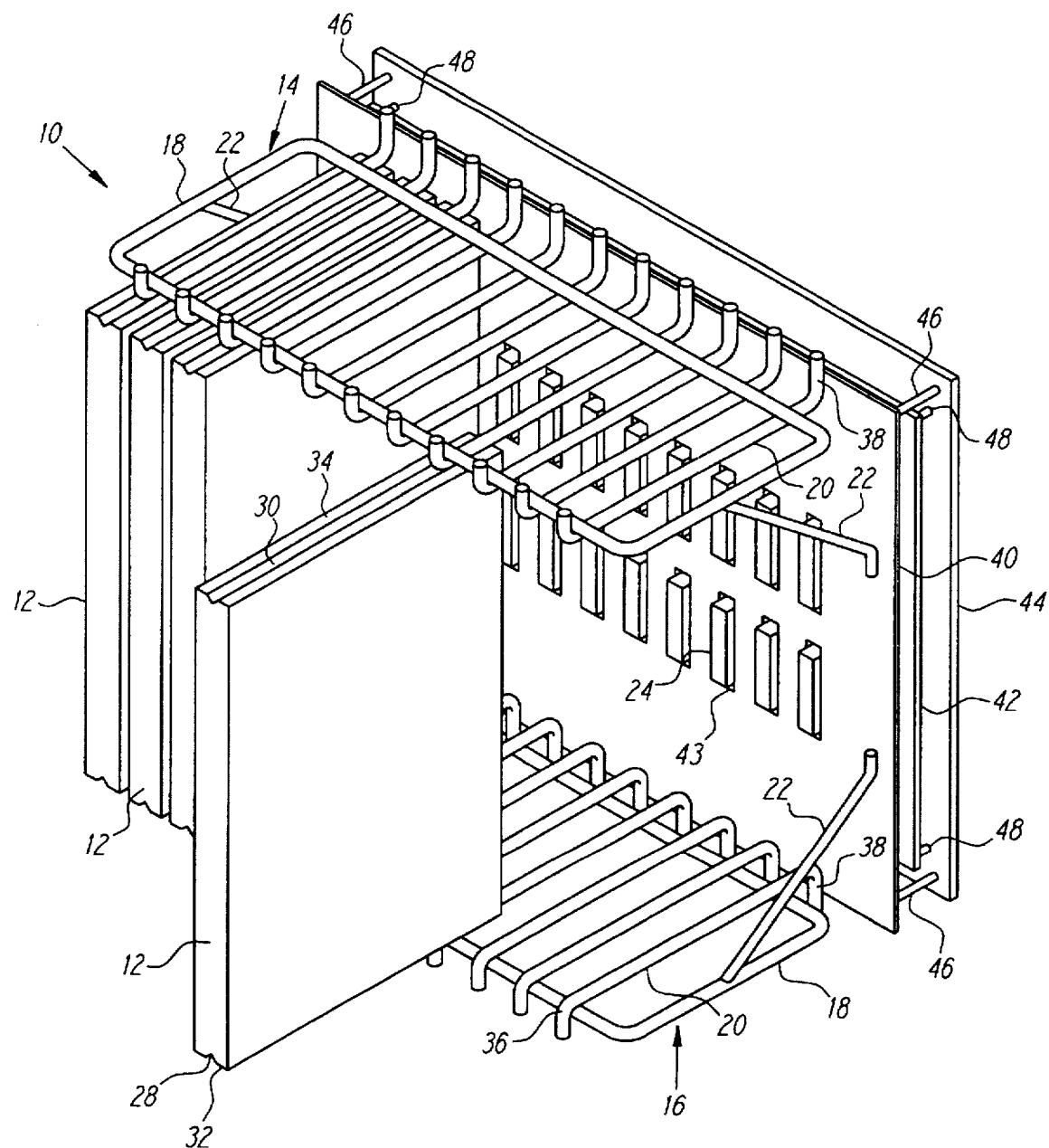
FIG. 1 is a perspective view of a rack assembly in accordance with a preferred embodiment of the present invention showing several electronic modules fully installed and another module partially installed.

Referring now to the drawings, FIG. 1 depicts a rack assembly 10 for support and alignment of electronic modules 12 according to a preferred embodiment of the present invention. Also shown are electronic modules 12 installed in the rack assembly 10. In the preferred embodiment, the rack assembly 10 is designed to accommodate enclosed electronic modules 12 having grooves 30 and 28 formed in the top 34 and bottom 32, respectively (It is to be understood that the use of terms referring to orientation, such as "top," "bottom," "front" or "back" are merely for convenience in describing the invention, and as will be apparent, may change depending upon the application in which the invention is being used.

The rack assembly 10 preferably comprises a pair of mirror-imaged frame assemblies, an upper frame 14 and a lower frame 16, positioned parallel to each other. Because the frames 14 and 16 are constructed as mirror images of each other, a description of the lower frame 16 will also serve as a description of the upper frame 14, the specific elements of each frame 14 and 16 being referred to by like numbers throughout the description and drawings.

Figure 2:
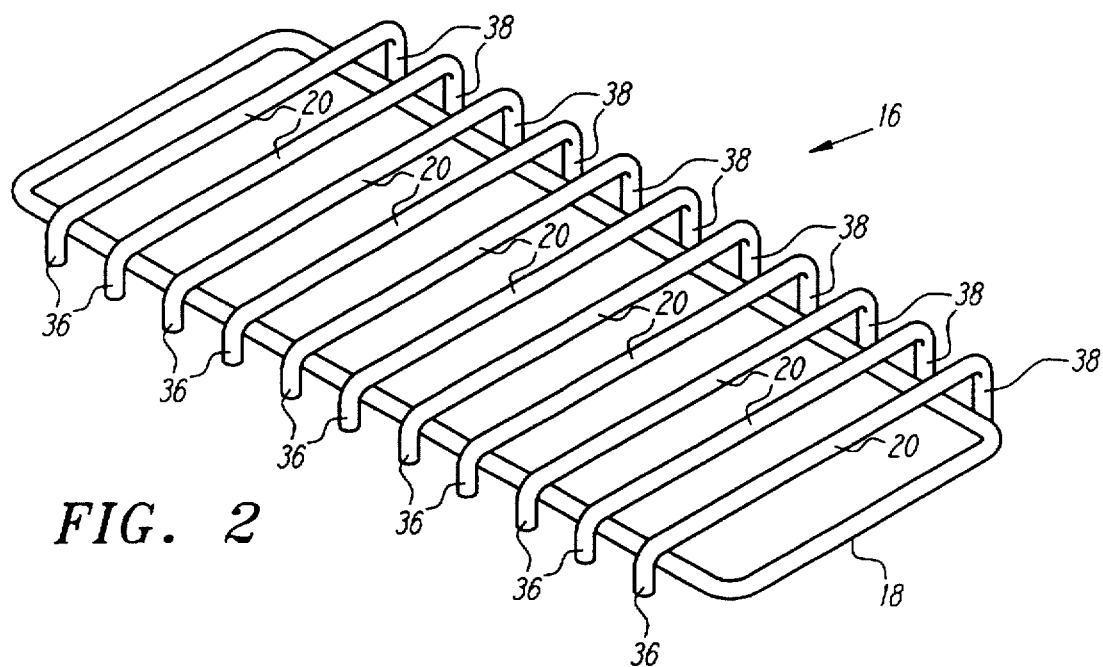
FIG. 2 is a perspective view of a preferred frame for use in a rack assembly.

As shown in FIG. 2, the frame 16 comprises a support member 18 and a plurality of guide members 20 attached to the support member 18. In a preferred form, the support member 18 is of a generally rectangular shape and is made from one or more metal bars formed and connected into a rectangular shape. In alternative embodiments the support member 18 may be composed of a series of parallel bars which may or may not be connected to each other, or other configurations of bars which will be familiar to those skilled in the art.

Figure 4:
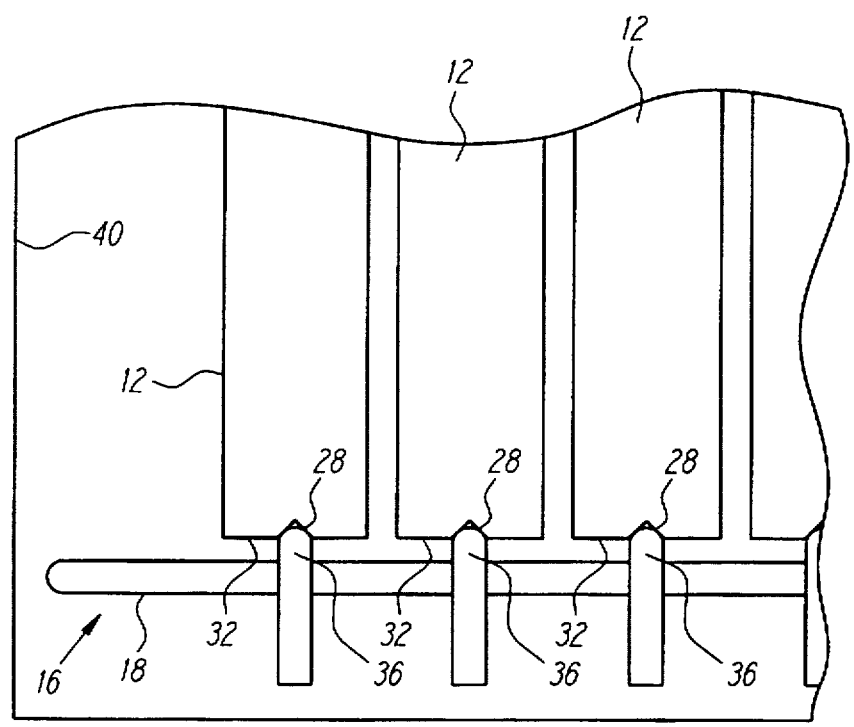
FIG. 4 is a detailed partial front view of electronic modules installed in a rack assembly in accordance with a preferred embodiment of the present invention.

A plurality of guide members 20 is attached to the interior side of the support member 18, the guide members 20 being aligned parallel to each other. The longitudinal direction of the guide members 20 defines the insertion/extraction direction for the modules 12. In the preferred embodiment, the guide members 20 are made of round metal bars such as steel or aluminum. As best shown in FIG. 4, the size and shape of the guide members 20 is defined such that the guide members 20 are adapted to be received in a bottom groove 28 formed in a bottom of the modules 12. In a preferred form, the guide members 20 are evenly spaced on the support member 18. The distance between each guide member 20 is slightly greater than a width A of the modules 12 (shown in FIG. 4). In an alternative embodiment, the spacing between the guide members 20 may be varied to accommodate modules 12 of varying width A.

Returning to FIG. 2, the guide members 20 extend beyond the outside of the support member 18 and are bent away from the interior side of the support member 18 to which they are attached. At the entrance side of the rack assembly 10, where the insertion of the modules 12 is initiated, the guide members 20 are bent gradually to provide a lead-in 36 for the modules 12. Hence, in the lead-in area of the rack assembly 10, the opposing guide members 20 on the upper frame 14 and lower frame 16 diverge from parallel creating a wider opening at the entrance to the rack assembly 10. The lead-in 30 makes it easier to start and align the grooves 28 and 30 in a module 12 to the guide members 20 when inserting a module 12 into the rack assembly 10.

The back ends 34 of the guide members 20 are bent more sharply than the lead-in 30 to provide a surface for attaching the frames 14 and 16, for example, to a backplane 40 of an electronic enclosure. (Only the backplane 40 and a rear wall 44 of the enclosure are shown in FIG. 5.)

Again referring to FIG. 1, the two frame assemblies 14 and 16 are mounted horizontally with the interior sides of the support members 18 having the guide members 20 attached thereto facing one another, with the upper frame 14 parallel to, and directly above the lower frame 16 such that the frames 14 and 16 are mirror images of each other. The upper frame 14 and the lower frame 16 are spaced apart so that the minimum distance between the opposing guide members 20 of each frame is less than the height of the modules 12, and also so that the horizontal lateral distance between the support members 20 of each frame is greater than the height of the modules 12. This spacing causes the guide members 20 to be received in the grooves 28 and 30 of the module 12 while also allowing the module 12 to fit between the support members 20.

Figure 5:
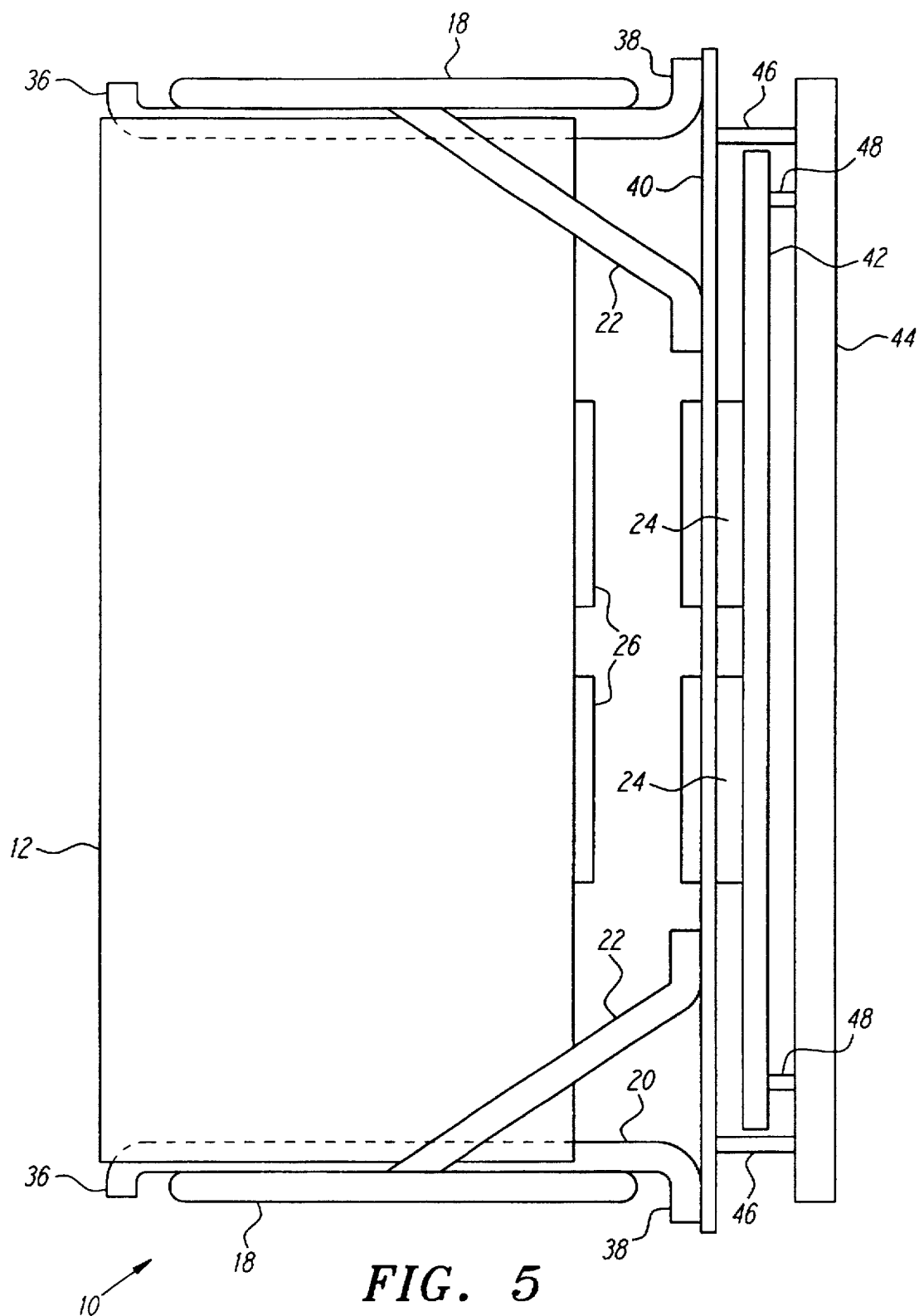
FIG. 5 is a side view of a preferred rack assembly.

As shown in FIGS. 1 and 5, the rack assembly 10 may be mounted to a heatplate 40 of the electronic module enclosure (only a rear wall 44 of the electronics enclosure is shown). As mentioned above, the rack assembly 10 may be attached to the heatplate 40 by rigidly attaching the back ends 38 of the guide members 20 of the frames 14 and 16 to the heat plate 40 with the frames 14 and 16 and guide members 20 perpendicular to the heat plate 40. Cantilever braces 22 are preferably connected between the frames 14 and 16 and the heat plate 40 at both ends of each frame 14 and 16. Those skilled in the art will appreciate that additional braces 32 may be used depending on the loads encountered in the particular application in which the invention is being used.

The frames 14 and 16 may be attached to the heat plate 40 by welding as shown in FIG. 5, or by using screws, clamps or adhesive, or by any other suitable means known in the art.

In alternative forms of the present invention not shown in the figures, the rack assembly 10 may be mounted directly to a backpanel or directly to a rear panel of the electronic enclosure in similar fashion to mounting to the backplane 40 as described above. These forms may be useful in cases where a heat plate is not required or where the heat plate is not structurally strong enough to support the rack assembly 10 and modules 12.

Referring to FIGS. 1 and 5, the backplane 46 generally has backplane electrical connectors 24 which mate with module electrical connectors 26 on the back of the modules 12. The heat plate 40 has slots 43 through which backplane electrical connectors 24 protrude. The backplane 46 has standoffs 48 into which fasteners (not shown) engage to attach the backplane to a rear wall 44 of the electronics enclosure.

Turning to FIG. 5, the rack assembly 10 and heat plate 40 are installed in an electronic enclosure (only a rear wall 44 of the electronic enclosure is shown) by attaching the heat plate 40 to the rear wall 44 of the electronic enclosure. The heat plate 40 is provided with standoffs 45 into which fasteners (not shown) are engaged and tightened to secure the rack assembly 10 to the rear wall 44. The rack assembly 10 is positioned relative to the backplane 46 on the rear wall 44 so that the guide members 20 of the frames 14 and 16 align the modules 12 to mate with their respective backplane connectors 24.

Figure 3:
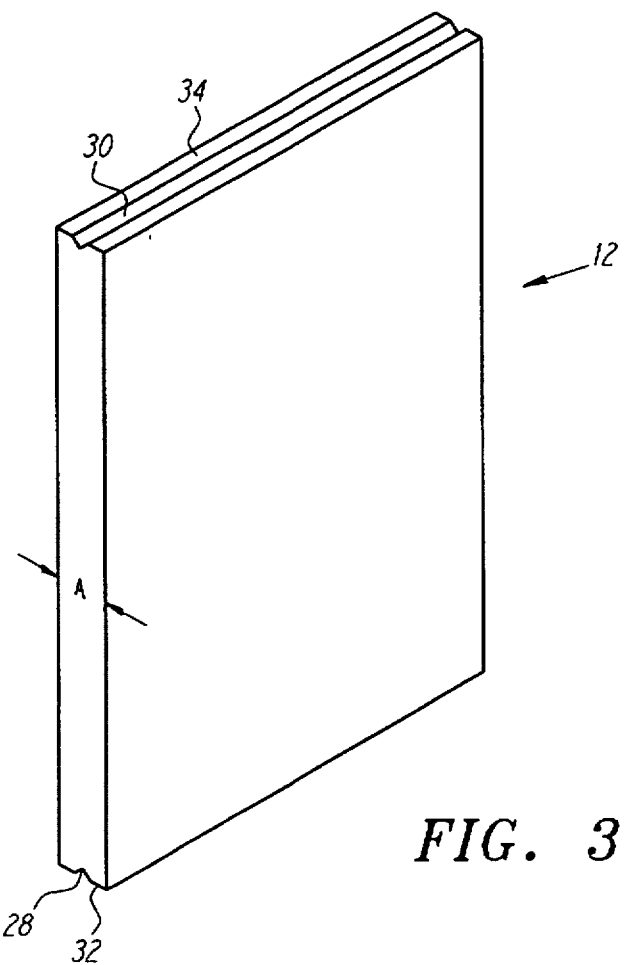
FIG. 3 is a perspective view of a preferred electronic module.

Referring now to FIG. 3, in another aspect of the present invention, the modules 12 comprise a rectangular box defining a top 34 and a bottom 32. The top 34 and bottom 32 have a top groove 30 and a bottom groove 28, respectively, formed in their surfaces and adapted to receive the guide members 20 of the rack assembly 10. As best shown in FIG. 4, in a preferred form of the present invention, the grooves 30 and 28 (only the bottom groove 28 is shown in FIG. 4) are V-shaped. Also, the open end of the V-shaped grooves 30 and 28 is wider than the diameter of the guide members 20, and the depth of the grooves 30 and 28 is approximately the same as the radius of the guide members 20. In a preferred form, the diameter of the guide members 20 is 6 mm, the depth of the grooves 30 and 28 is 3 mm and the angle of the V-shape is 75 degrees. Those skilled in the art will appreciate that alternative shapes and sizes of grooves and guide members may be used. The radius of the guide members 20 in the grooves provides two lines of contact for supporting the module, with a minimum of contact surface area, to reduce friction.

Referring back to FIG. 1, a module 12 is installed in the rack assembly 10 by aligning the inside ends of top groove 30 and bottom groove 28 in the module 12 with the corresponding lead-ins 30 of the guide members 20 of the upper frame 14 and lower frame 16. The module 12 is then pushed into the rack assembly 10 toward the heat plate 20. As the module 12 enters the rack assembly 10, the guide members 20 are received in the grooves 30 and 28 of the module 12. As the guide members 20 contact the walls of the grooves 30 and 28, the module is forced into alignment parallel to the guide members 20 and other modules 12. Once the front ends of the grooves 30 and 28 have traveled past the lead-ins 30, the module can be rested on the guide member 20 of the lower frame 16 which supports the weight of the module 12, and the module can be slid the rest of the way into the rack assembly 10. As the module 12 approaches the heat plate 40, the module electrical connectors 26 on the back of the module 12 mate with the backplane electrical connectors 24 on the backplane 42. The guide members 20 fix the positions of the connectors into alignment with the backplane connectors. Therefore, no conical guides or pins are needed.

A locking mechanism (not shown), such as that disclosed in concurrently filed U.S. application Ser. No. 08/688,383, entitled "Latch for Electronic Modules," incorporated herein by reference, may be used to secure the module 12 in place.

While the design shown in FIGS. 1–5 is preferably used with box-type enclosed electronic modules, it can also be adopted for use with open PCBA modules. The top and bottom surfaces, or rails attached to an open PCBA, have a V-shaped groove to slidably mate with the guide members 20. The additional metal to metal surface contact between the module and rack, may also provide improved cooling of the module.

Thus, the present invention provides an improved assembly and method for support and alignment of electronic modules. While the above description contains many specifics, these should not be construed as limitations on the scope of the invention, but rather as examples of particular embodiments thereof. Many other variations are possible.

Accordingly, the scope of the present invention should be determined not by the embodiments illustrated above, but by the appended claims and their legal equivalents.

What is claimed is:

1. A method for aligning and supporting electronic modules having grooves, said method comprising the following steps providing a first frame and a second frame, said first frame disposed parallel and opposite said second frame, said first frame having a support member and a plurality of guide members attached to said support member, said guide members being substantially parallel, said guide members adapted to receive the grooves in the electronic modules, said second frame having a support member and a plurality of guide members attached to said support member, said guide members being substantially parallel to, and spaced the same distance as, said guide members on said first frame, said guide members adapted to receive the grooves in the electronic modules, and installing the electronic modules onto said rack assembly by aligning the grooves in the modules to said guide members of said frames and sliding the electronic module into said rack assembly, said guide members being received in said grooves.

2. The method of claim 1 further comprising the step of attaching said rack assembly to a backpanel of an electronic enclosure.

3. The method of claim 1 wherein said first frame is a mirror image of said second frame.

4. The method of claim 1 wherein said guide members comprise round bars.

* * * * *